US012621954B2

(12) United States Patent
Yoshida et al.

(10) Patent No.: US 12,621,954 B2
(45) Date of Patent: May 5, 2026

(54) ELECTRONIC DEVICE

(71) Applicant: HITACHI, LTD., Tokyo (JP)

(72) Inventors: Koumei Yoshida, Tokyo (JP); Goro Hamamoto, Tokyo (JP)

(73) Assignee: HITACHI, LTD., Tokyo (JP)

( * ) Notice: Subject to any disclaimer, the term of this patent is extended or adjusted under 35 U.S.C. 154(b) by 199 days.

(21) Appl. No.: 18/281,816

(22) PCT Filed: Mar. 7, 2022

(86) PCT No.: PCT/JP2022/009602
§ 371 (c)(1),
(2) Date: Sep. 13, 2023

(87) PCT Pub. No.: WO2022/270024
PCT Pub. Date: Dec. 29, 2022

(65) Prior Publication Data
US 2024/0164045 A1 May 16, 2024

(30) Foreign Application Priority Data

Jun. 22, 2021 (JP) .................................. 2021-103503

(51) Int. Cl.
*H05K 7/20* (2006.01)
(52) U.S. Cl.
CPC ..... *H05K 7/20127* (2013.01); *H05K 7/20445* (2013.01)
(58) Field of Classification Search
CPC ............ H05K 7/20127; H05K 7/20445; H01L 23/467; G06F 1/20
(Continued)

(56) References Cited

U.S. PATENT DOCUMENTS

| 10,617,021 | B1 | 4/2020 | Olivieri et al. |
| 2015/0216074 | A1 | 7/2015 | Nishihara et al. |
| 2016/0307818 | A1 | 10/2016 | Kawase et al. |

FOREIGN PATENT DOCUMENTS

| DE | 112017000205 T5 * | 8/2018 | ............. G06F 1/187 |
| EP | 1052884 A2 * | 11/2000 | ........... H05K 9/0041 |

(Continued)

OTHER PUBLICATIONS

Japanese Office Action received in corresponding Japanese Application No. 2021-103503 dated Dec. 17, 2024.

(Continued)

*Primary Examiner* — Mandeep S Buttar
*Assistant Examiner* — Kyle Oxenknecht
(74) *Attorney, Agent, or Firm* — MATTINGLY & MALUR, PC

(57) ABSTRACT

Provided is an electronic device that can prevent an increase in a temperature of an internal electronic component, and prevent a heat influence on adjacent electronic devices or the like. The electronic device includes: a circuit board on which a heat-generating element configured to generate heat is mounted; a housing in which the circuit board is housed; a heat dissipation portion connected to the housing and configured to dissipate heat; a heat transfer member disposed between the heat-generating element and the heat dissipation portion, and configured to transfer heat generated by the heat-generating element to the heat dissipation portion; and a housing cover provided on a side of the heat dissipation portion opposite to a side of the heat transfer member, in which a convection area that is a space where air convects is provided between the heat dissipation portion and the housing cover.

2 Claims, 6 Drawing Sheets

(58) Field of Classification Search
     USPC ......................................................... 361/707
     See application file for complete search history.

(56)                    References Cited

FOREIGN PATENT DOCUMENTS

JP        2016032031  A  *  3/2016
JP      2016-143769  A       8/2016
JP        2020088050  A  *  6/2020
JP          6877523  B1     5/2021
KR      20080065108  A  *  7/2008    .......  G02F 1/133308

OTHER PUBLICATIONS

International Search Report of PCT/JP2022/009602 dated May 24, 2022.
Written Opinion of PCT/JP2022/009602 dated May 24, 2022.
Extended European Search Report received in corresponding European Application No. 22827945.1 dated May 28, 2025.

* cited by examiner

[FIG. 1]
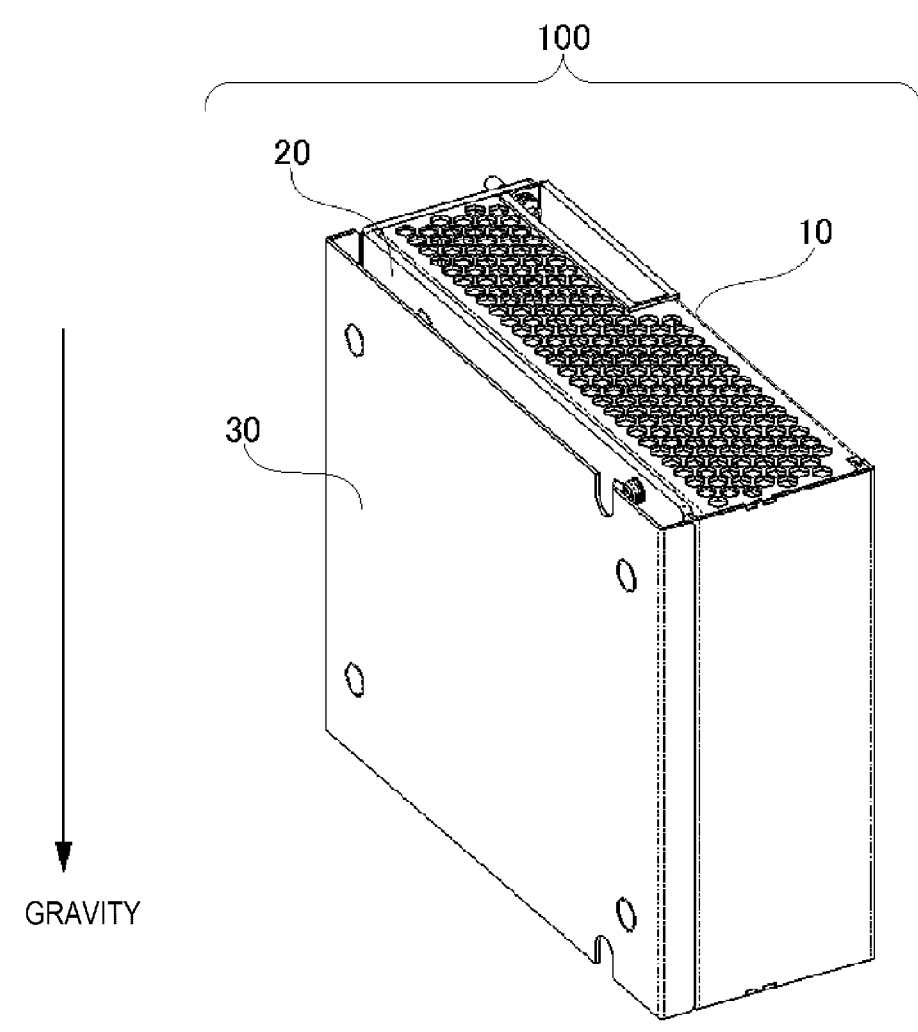
GRAVITY

[FIG. 2]
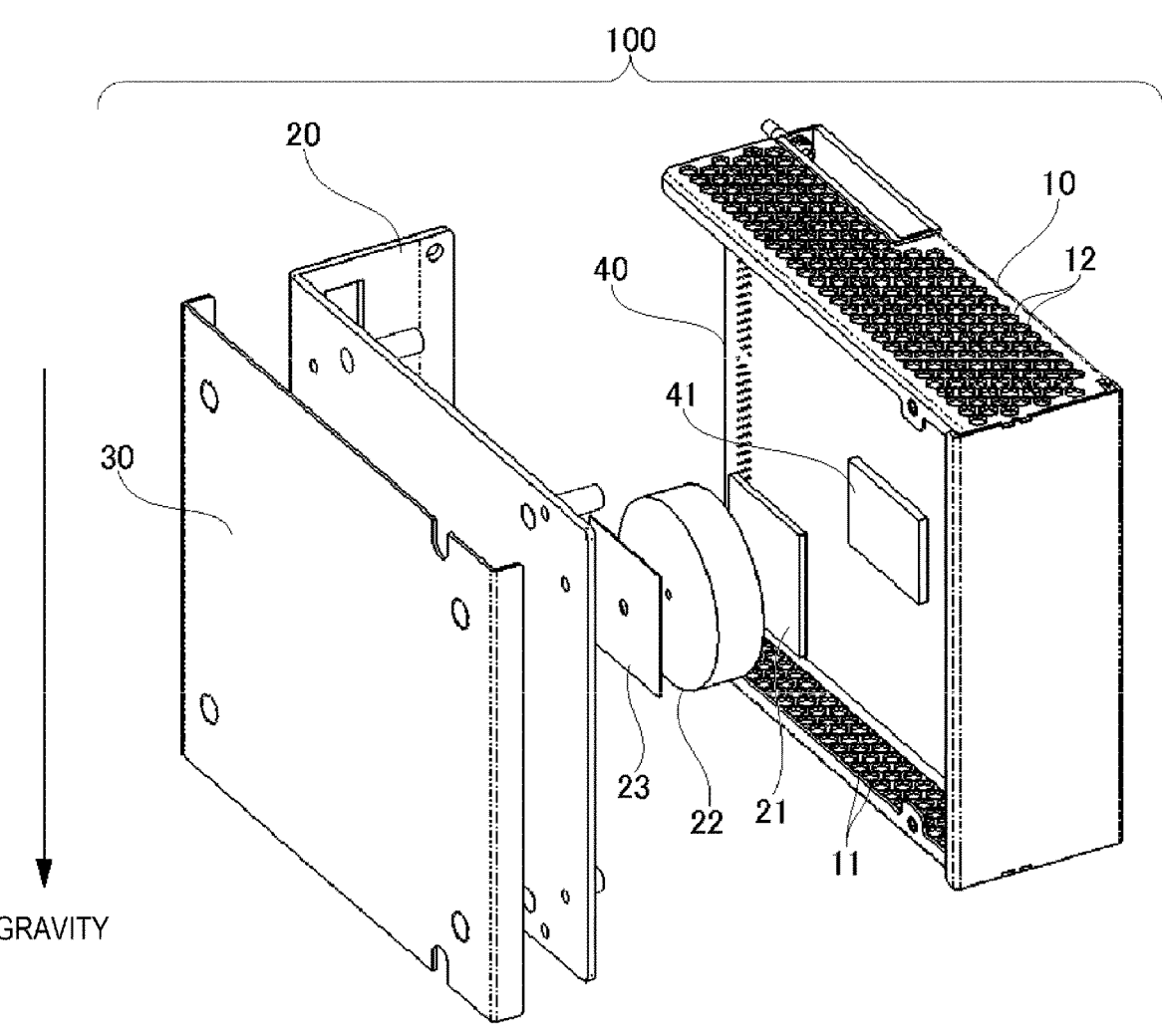

[FIG. 3]

[FIG. 4]
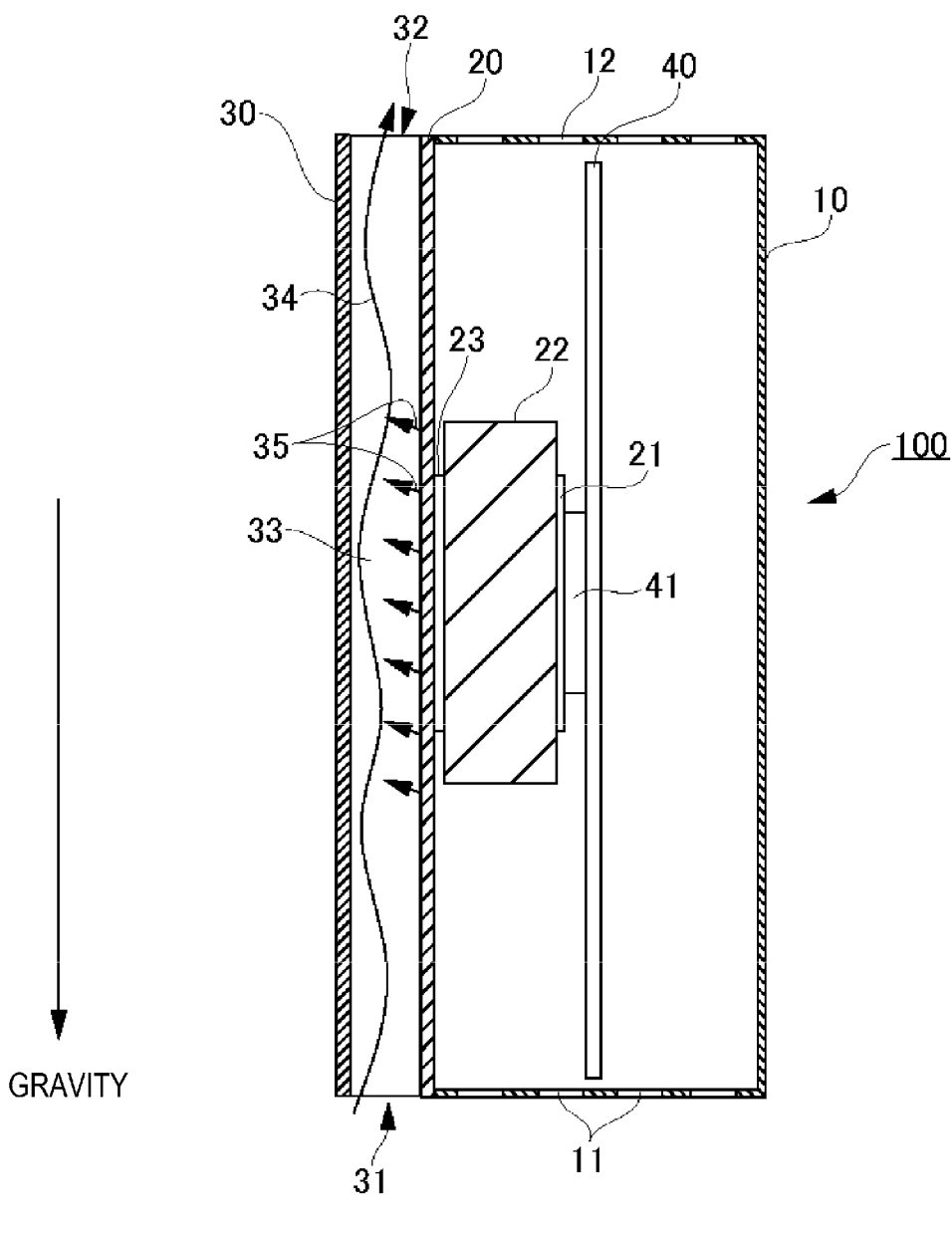

[FIG. 5]
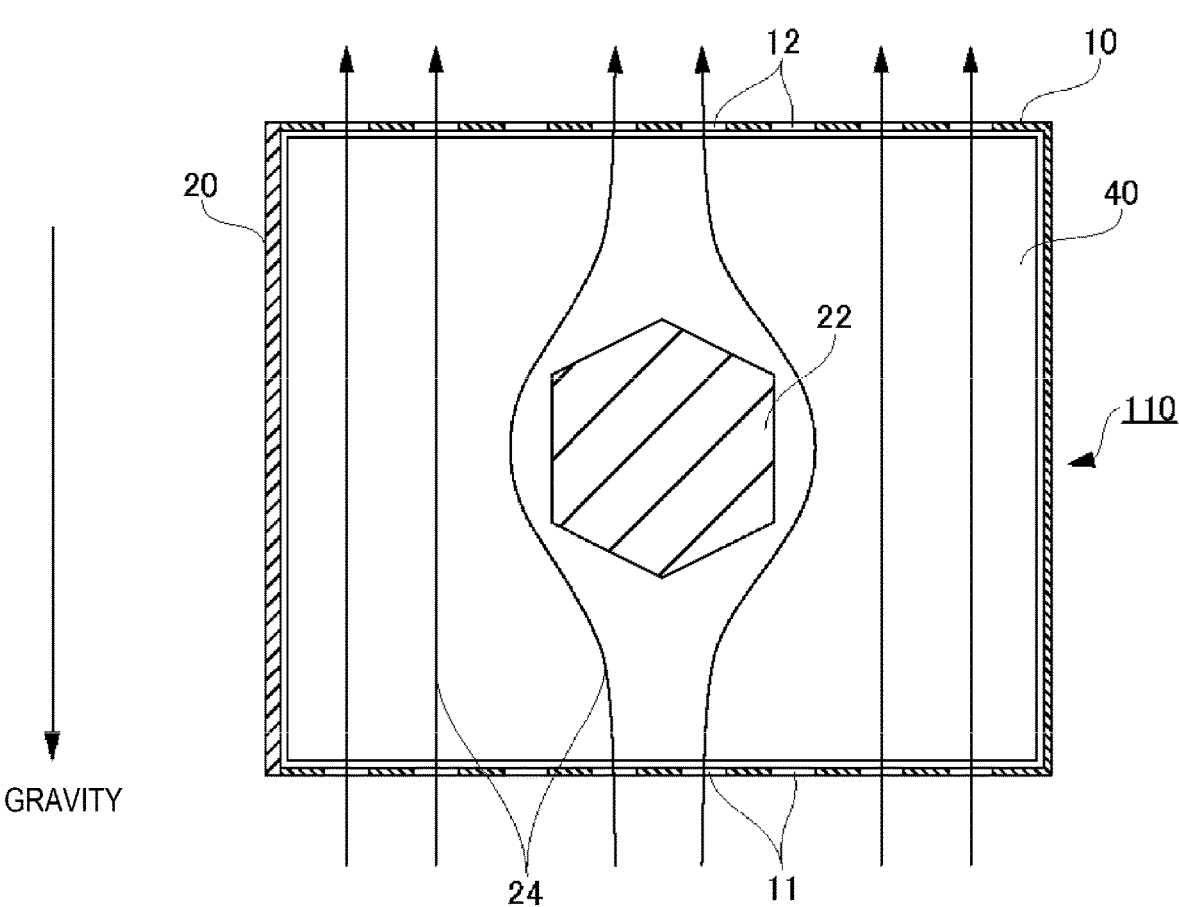
GRAVITY

[FIG. 6]
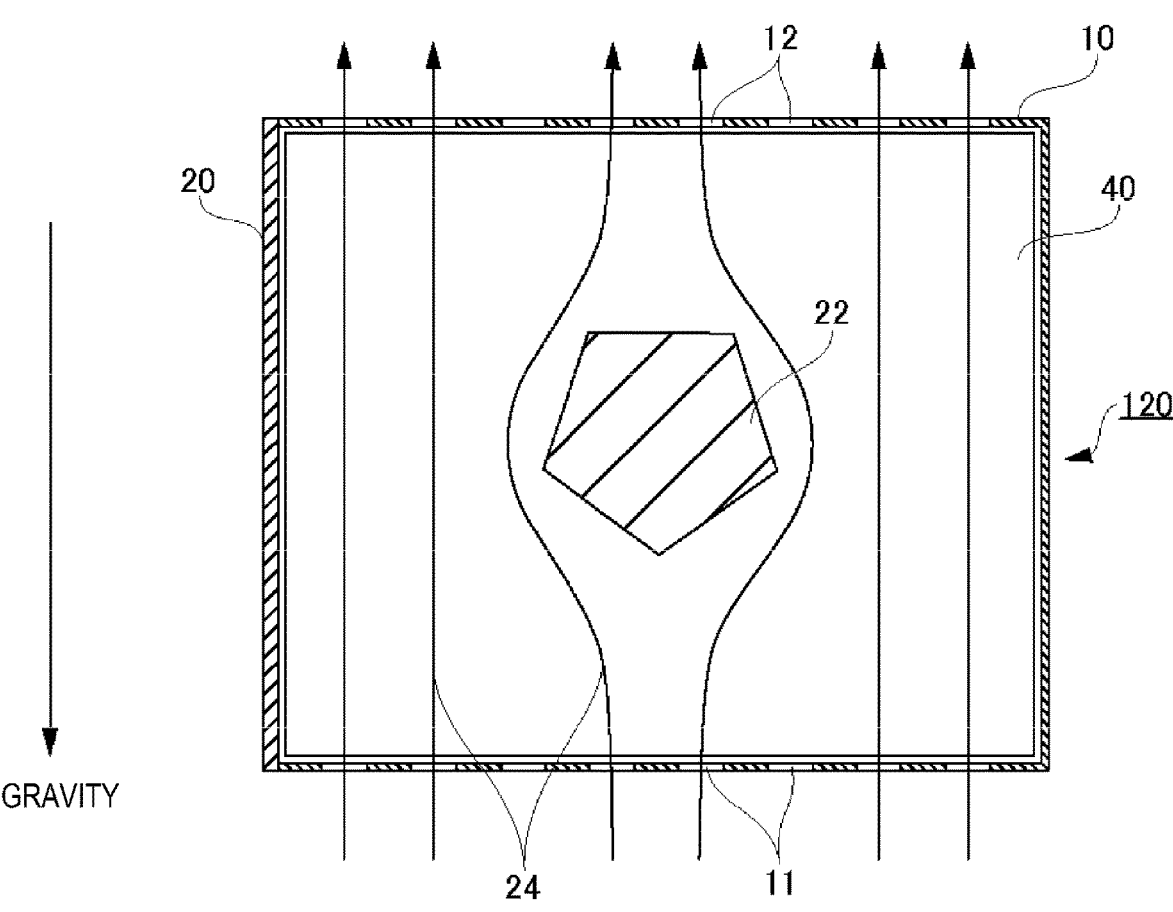
GRAVITY

ELECTRONIC DEVICE

TECHNICAL FIELD

The present invention relates to an electronic device including a heat-generating element, such as an electronic component disposed on a circuit board.

BACKGROUND ART

Many electronic devices include electronic circuits in each of which electronic components are mounted on a printed wiring board (PWB).

The electronic components such as an integrated circuit, a transistor, a diode, a resistor, and a capacitor are soldered on a PWB on which wiring is formed by lithography to form a printed circuit board (PCB). A certain type of electronic component generates heat due to an operation, and is thus used together with a cooling structure for heat dissipation.

As the cooling structure, a heat sink, a heat pipe, or the like is often used.

Generally, when heat generated by an electronic component is to be dissipated to the heat sink that dissipates heat to outside, a housing, or the like, each heat-generating component such as an integrated circuit is attached via a heat transfer member such as a heat pipe or a metal block.

In recent years, an amount of information to be processed by the electronic device increases, and an integrated circuit that can more swiftly operate is used, and therefore a heat generation amount also tends to increase. Therefore, a cooling structure that efficiently cools the electronic components is required.

In order to improve cooling efficiency, forced air cooling in which a fan or the like is used and a heat transfer amount based on convection is increased is efficient.

However, for reasons that in an industrial device for which long-term reliability is required, cooling capacity when the fan is stopped due to a failure or the like remarkably deteriorates, and a structure that supplies a power supply to the fan is necessary, improvement in a natural cooling structure in which the PCB and the housing themselves are used as main heat-dissipating bodies is being examined.

Generally, a method for mounting the heat sink on the heat-generating component, a structure using a heat dissipation heat pipe as a heat transfer path to the housing in contact with the atmosphere, and a method using a metal block having high thermal conductivity, typically aluminum (Al), for the same purpose are well known.

For example, in an electronic apparatus disclosed in the following PTL 1, a heat transfer member is provided between an upper portion of a heat-generating element and a housing, and heat is transferred to the housing via the heat transfer member, thereby dissipating the heat.

CITATION LIST

Patent Literature

PTL 1: JP2016-143769A

SUMMARY OF INVENTION

Technical Problem

However, when the electronic apparatus disclosed in PTL 1 is applied to a configuration in which a plurality of electronic apparatuses are adjacent to one another, problems may occur.

Since the electronic apparatus disclosed in PTL 1 dissipates heat to the housing, the heat may be transferred to other electronic apparatuses adjacent to a housing heat dissipation surface, and inside of other adjacent electronic apparatuses is heated, so that there is a problem that an electronic component malfunctions or life is shortened.

Further, since the heat dissipation surface and other electronic apparatuses (electronic devices) are adjacent to each other, there is no space for dissipating the heat, and there is also a problem that an increase in a temperature inside the electronic apparatus itself is not prevented.

The invention has been made to solve the problems described above, and an object thereof is to provide an electronic device that can prevent an increase in a temperature of an internal electronic component, and prevent a heat influence on adjacent electronic devices or the like.

The object described above and other objects of the invention and novel features of the invention will become apparent from the description of the present specification and the accompanying drawings.

Solution to Problem

In order to achieve the object described above, an electronic device according to the invention includes: a circuit board on which a heat-generating element configured to generate heat is mounted; and a housing in which the circuit board is housed.

The electronic device according to the invention further includes: a heat dissipation portion connected to the housing and configured to dissipate heat; a heat transfer member disposed between the heat-generating element and the heat dissipation portion, and configured to transfer heat generated by the heat-generating element to the heat dissipation portion; and a housing cover provided on a side of the heat dissipation portion opposite to a side of the heat transfer member.

In addition, in the electronic device according to the invention, a convection area that is a space where air convects is provided between the heat dissipation portion and the housing cover.

Advantageous Effects of Invention

According to an electronic device of the invention described above, since the heat generated by the heat-generating element is transferred to the heat dissipation portion by the heat transfer member, it is possible to prevent an increase in a temperature of an electronic component inside the housing.

Then, the housing cover is provided on the side of the heat dissipation portion opposite to the side of the heat transfer member, and the convection area is provided between the heat dissipation portion and the housing cover. Accordingly, air can be convected in the convection area, and the heat of the heat dissipation portion can be dissipated to cool the heat dissipation portion.

Further, since the heat is dissipated through the convection area and the heat in the convection area is thermally insulated by the housing cover, it is possible to prevent a heat influence on an external apparatus adjacent to the electronic device.

Problems, configurations, and effects other than those described above will become apparent by the following description of the embodiment.

BRIEF DESCRIPTION OF DRAWINGS

FIG. 1 is a schematic configuration diagram (perspective view) of an electronic device according to a first embodiment of the invention.

FIG. 2 is an exploded perspective view of the electronic device in FIG. 1.

FIG. 3 is a cross-sectional view of a cross section including a heat transfer member of the electronic device in FIG. 1.

FIG. 4 is a cross-sectional view of a cross section including the heat transfer member and a convection area of the electronic device in FIG. 1.

FIG. 5 is a cross-sectional view of a cross section including a heat transfer member of an electronic device according to a first modification.

FIG. 6 is a cross-sectional view of a cross section including a heat transfer member of an electronic device according to a second modification.

DESCRIPTION OF EMBODIMENTS

Hereinafter, an embodiment and examples according to the invention will be described with reference to sentences or the drawings. However, structures, materials, other specific various configurations, and the like shown in the invention are not limited to the embodiment and examples described herein, and appropriate combinations and improvements can be made in a scope not changing the gist. Further, elements not directly related to the invention are not shown.

An electronic device according to the invention includes a circuit board on which a heat-generating element that generates heat is mounted, and a housing in which the circuit board is housed.

The electronic device according to the invention further includes: a heat dissipation portion connected to the housing and configured to dissipate heat; a heat transfer member disposed between the heat-generating element and the heat dissipation portion, and configured to transfer heat generated by the heat-generating element to the heat dissipation portion; and a housing cover provided on a side of the heat dissipation portion opposite to a side of the heat transfer member.

In addition, in the electronic device according to the invention, a convection area that is a space where air convects is provided between the heat dissipation portion and the housing cover.

In the configuration of the electronic device described above, the heat-generating element is an element that generates heat, and is, for example, an element that generates heat due to an operation and the like of the heat-generating element itself.

Specific examples of the heat-generating element include an electronic component such as an integrated circuit, a transistor, a diode, a resistor, or a capacitor.

In the configuration of the electronic device described above, the housing houses the circuit board on which the heat-generating element described above is mounted.

In the configuration of the electronic device described above, the heat dissipation portion has a configuration that dissipates heat.

As a material of the heat dissipation portion, for example, a material that easily dissipates heat, such as aluminum or a steel plate, can be used.

In the configuration of the electronic device described above, the heat transfer member is disposed between the heat-generating element and the heat dissipation portion, and transfers the heat generated by the heat-generating element to the heat dissipation portion.

As a material of the heat transfer member, it is desirable to use a material having high thermal conductivity and high corrosion resistance, typically aluminum. When the thermal conductivity of the heat transfer member is high, efficiency of heat dissipation can be increased, and when the heat transfer member has corrosion resistance, life of the heat transfer member can be extended to reduce a maintenance cost of the electronic device.

The heat transfer member can have any one of a configuration in which the heat transfer member is in direct contact with the heat-generating element and the heat dissipation portion and a configuration in which the heat transfer member is connected to the heat-generating element and the heat dissipation portion via a thermally conductive member having good thermal conduction (for example, a gel-like member or grease).

In the configuration of the electronic device described above, the housing cover is provided on the side of the heat dissipation portion opposite to the side of the heat transfer member. In this way, when the housing cover is provided on the side of the heat dissipation portion opposite to the side of the heat transfer member, the heat from the heat dissipation portion can be thermally insulated, and the heat from the heat dissipation portion can be prevented from being directly directed to other surrounding electronic devices.

In the configuration of the electronic device described above, the convection area that is the space where the air convects is provided between the heat dissipation portion and the housing cover.

When the convection area is provided, the heat dissipated from the heat dissipation portion can be moved by the convection. Therefore, the heat dissipation portion can be cooled. Further, it is possible to prevent an increase in a temperature of the housing cover due to the heat dissipated from the heat dissipation portion.

As the convection generated in the convection area, three configurations including natural convection, combination of the natural convection and forced convection, and the forced convection are considered.

When the natural convection is generated in the convection area, openings are provided in a lower surface and an upper surface of the convection area between the heat dissipation portion and the housing cover. Since air warmed by the heat dissipated from the heat dissipation portion becomes light and rises, when the opening is provided in the upper surface of the convection area, the warmed air can be discharged through the opening in the upper surface to outside of the electronic device. Further, since new air that flows in through the opening in the lower surface can be supplied, the natural convection can be generated, and the heat dissipation portion can be cooled by the newly supplied air.

When the forced convection is generated in the convection area, a configuration for generating the forced convection such as a fan is provided, and an installation position, an installation direction, an air volume, and the like are set to generate predetermined convection.

Even when the forced convection is generated in the convection area, the opening for allowing the air to flow into the convection area and the opening for discharging the air from the convection area to the outside are preferably provided in the convection area, and cooling effects for the heat dissipation portion based on the forced convection can be improved by providing the openings. Further, instead of providing the openings, heat dissipation members made of a material that easily dissipates heat can also be provided. However, when there are other electronic devices or the like adjacent to the electronic device, the openings or the heat dissipation members are provided in a surface on a side where there are no other adjacent electronic devices or the like (for example, when there are other devices on left and right surfaces, the openings or the heat dissipation members are provided in a lower surface, an upper surface, or a front surface). Further, when there are other adjacent electronic devices or the like and the heat dissipation members are provided, it is desirable that a material of the heat dissipation member is a material that dissipates heat more easily than a material of the housing cover, and heat is mainly dissipated from the heat dissipation members.

In the configuration of the electronic device described above, it is more preferable that the convection is generated not only in the convection area between the heat dissipation portion and the housing cover, but also near the heat transfer member inside the housing.

Similar to the convection generated in the convection area, as the convection generated near the heat transfer member, three configurations including the natural convection, combination of the natural convection and the forced convection, and the forced convection are considered.

When the natural convection is generated near the heat transfer member, an air intake opening (ventilation hole) for taking air into the housing is provided in a lower surface of the housing, and an air exhaust opening (ventilation hole) for discharging the air in the housing to outside is provided in an upper surface of the housing. When the air exhaust opening (ventilation hole) is provided in the upper surface of the housing, the air warmed by the heat transfer member can be discharged through the opening (ventilation hole). Further, when the air intake opening (ventilation hole) is provided in the lower surface of the housing, new air that flows in through the opening (ventilation hole) can be supplied to generate the natural convection, and the heat transfer member can be cooled by the newly supplied air.

When the forced convection is generated near the heat transfer member, a configuration for generating the forced convection such as a fan is provided, and an installation position, an air direction, an air volume, and the like are set to generate predetermined convection.

Even when the forced convection is generated near the heat transfer member, the opening (ventilation hole) for taking the air into the housing and the opening (ventilation hole) for discharging the air in the housing to the outside are preferably provided in the housing. Cooling effects for the heat transfer member based on the forced convection can be improved by providing the openings (ventilation holes). Further, instead of providing the openings, heat dissipation members made of a material that easily dissipates heat can also be provided. However, when there are other electronic devices or the like adjacent to the electronic device, the openings or the heat dissipation members are provided in a surface on a side where there are no other adjacent electronic devices or the like (for example, when there are other devices on left and right surfaces, the openings or the heat dissipation members are provided in a lower surface, an upper surface, or a front surface).

When a configuration in which the natural convection is generated in the convection area or near the heat transfer member inside the housing is adopted, compared with a configuration in which the forced convection is generated, it is possible to reduce power consumption and avoid a life problem of a fan or the like.

In the configuration in which the forced convection is generated in the convection area or near the heat transfer member inside the housing, for example, a configuration in which the space of the convection area and the space inside the housing are coupled to each other, and the forced convection is circulated between the spaces is also considered. Accordingly, even when the configuration such as a fan is not provided in each of the two spaces, one configuration can be shared, and more efficient cooling can be performed by convection that passes through the heat dissipation portion and the heat transfer member.

However, when the configuration in which the forced convection is circulated as described above is adopted, it is desirable that the openings or the heat dissipation members described above can be provided in at least one of the convection area and the housing such that heat is not accumulated in the coupled space, and heat can be dissipated to the outside of the electronic device.

It is desirable that a shape and disposition of the heat transfer member are set so as not to hinder the convection (natural convection or forced convection) generated near the heat transfer member inside the housing.

For example, when the heat transfer member is formed in a quadrangular column shape and is disposed such that sides of the quadrangle are disposed up and down, the convection is received by a plane, the convection is hindered by the plane, and a heat spot where heat is accumulated is generated on a back side that passes through the heat transfer member having the quadrangular column shape.

On the other hand, when the heat transfer member is formed in a cylindrical shape, an elliptical column shape, or a polygonal column shape having five or more corners, or when diagonal lines of the quadrangle (a square or a rhombus) of the heat transfer member having the quadrangular column shape are disposed up and down, the convection can be prevented from being hindered.

A protrusion such as a flat-plate-shaped fin can also be provided as a member for dissipating heat on the heat dissipation portion or the heat transfer member. For example, the protrusion such as a fin is provided on a surface of the heat dissipation portion on a convection area side or an outer surface of the heat transfer member such that the convection is not hindered. Accordingly, since convective air hits the protrusion, heat can be efficiently dissipated, and cooling effects can be improved.

According to the configuration of the electronic device of the invention, the circuit board on which the heat-generating element that generates heat is mounted, and the housing in which the circuit board is housed are provided.

Further, according to the configuration of the electronic device of the invention, the heat dissipation portion connected to the housing and configured to dissipate heat, the heat transfer member disposed between the heat-generating element and the heat dissipation portion and configured to transfer heat generated by the heat-generating element to the heat dissipation portion, and the housing cover provided on the side of the heat dissipation portion opposite to the side of the heat transfer member are provided.

Further, according to the configuration of the electronic device of the invention, the convection area where the air convects is provided between the heat dissipation portion and the housing cover.

Accordingly, since the heat generated by the heat-generating element is transferred to the heat dissipation portion by the heat transfer member, the heat generated by the heat-generating element can be moved to the heat dissipation portion, and an increase in a temperature of the electronic component inside the housing can be prevented. Then, the air can be convected in the convection area, the heat of the heat dissipation portion can be dissipated, and the heat dissipation portion can be cooled.

Further, since the heat is dissipated through the convection area and the heat in the convection area is thermally insulated by the housing cover, it is possible to prevent a heat influence on an external apparatus adjacent to the electronic device.

The electronic device according to the invention is suitable for use in a configuration in which a plurality of modules of electronic devices each including a heat-generating element are adjacently arranged in a horizontal direction.

When the electronic device according to the invention is applied to such a configuration, it is possible to prevent a heat influence on the adjacent modules.

Hereinafter, a specific embodiment of the invention will be described.

First Embodiment

A schematic configuration of an electronic device according to a first embodiment of the invention will be described with reference to the drawings.

The electronic device according to the present embodiment is suitable for use in, for example, a configuration in which a plurality of modules each including a heat-generating element are adjacently arranged in a horizontal direction, such as a small-size controller for an automation system in a manufacturing line.

FIG. 1 is a schematic configuration diagram (perspective view) of the electronic device according to the first embodiment of the invention.

FIG. 2 is an exploded perspective view of the electronic device in FIG. 1.

An electronic device 100 according to the present embodiment has a rectangular box shape whose longitudinal direction is a gravity direction as indicated by a downward arrow in FIGS. 1 and 2.

As shown in FIGS. 1 and 2, the electronic device 100 includes a housing 10, a heat dissipation portion 20, a housing cover 30, and a heat transfer portion 22.

As shown in FIG. 2, the housing 10 includes a front side surface, a lower surface, an upper surface, and a right side surface (not shown), and a circuit board 40 is housed in an internal space surrounded by the four surfaces.

In addition, air intake ventilation holes 11 for taking air into the housing 10 are provided in a lower surface of the housing 10, and air exhaust ventilation holes 12 for discharging the air in the housing 10 to outside of the housing 10 are provided in an upper surface of the housing 10.

As shown in FIG. 2, the heat dissipation portion 20 has a substantially L shape including a left side surface and a back side surface.

The housing 10 and the heat dissipation portion 20 are formed by, for example, pressing aluminum or a steel plate.

A heat-generating element 41 is mounted on the circuit board 40.

The heat-generating element 41 is an element that generates heat, and generates the heat when, for example, the heat-generating element 41 itself operates.

Specific examples of the heat-generating element 41 include an electronic component such as an integrated circuit, a transistor, a diode, a resistor, or a capacitor.

The heat transfer member 22 for transferring heat from the heat-generating element 41 to the heat dissipation portion 20 is provided between a surface of the heat-generating element 41 and the heat dissipation portion 20.

The heat transfer member 22 has a cylindrical shape as shown in FIG. 2, and is formed of, for example, an aluminum member.

A thermally conductive member 21 is provided between the heat-generating element 41 and the heat transfer member 22, and the heat-generating element 41 and the heat transfer member 22 are bonded to each other via the thermally conductive member 21 so as to enable heat transfer. Further, a thermally conductive member 23 is also provided between the heat transfer member 22 and the heat dissipation portion 20, and the heat transfer member 22 and the heat dissipation portion 20 are bonded to each other via the thermally conductive member 23 so as to enable heat transfer.

As the thermally conductive members 21 and 23, for example, a gel-like member or grease can be used.

Figure 3:
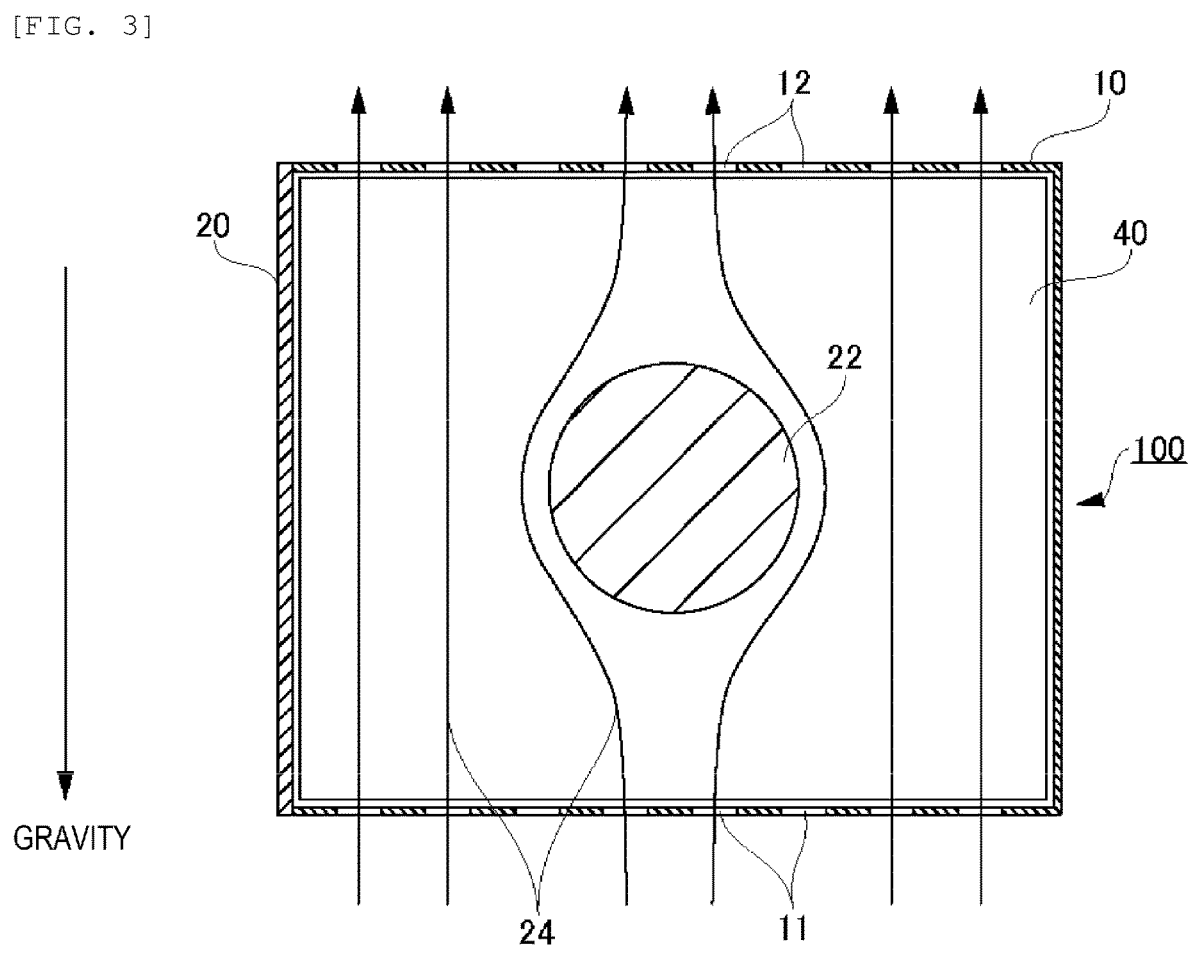

FIG. 3 is a cross-sectional view of a cross section including the heat transfer member 22 of the electronic device 100 in FIG. 1.

As indicated by arrows 24 in FIG. 3, an airflow taken in through the air intake ventilation holes 11 of the housing 10 flows along an outer shape of the heat transfer member 22 when approaching the heat transfer member 22, and is exhausted through the air exhaust ventilation holes 12 of the housing 10 from an upper portion of the heat transfer member 22.

The housing cover 30 is formed by, for example, pressing aluminum or a steel plate, or formed of a resin material.

A convection area is provided between the housing cover 30 and the heat dissipation portion 20.

FIG. 4 is a cross-sectional view of a cross section including the heat transfer member 22 and the convection area of the electronic device 100 in FIG. 1. The cross section in FIG. 4 is a cross section perpendicular to the cross section in FIG. 3.

As shown in FIG. 4, an opening 31 at a lower end and an opening 32 at an upper end are provided between the housing cover 30 and the heat dissipation portion 20, whereby an airflow (natural convection) indicated by an arrow 34 is generated in a convection area 33 between the openings 31 and 32. That is, the air flows into the convection area 33 through the opening 31 at the lower end, the air is discharged from the convection area 33 through the opening 32 at the upper end to the outside of the electronic device 100, and natural convection indicated by the arrow 34 is generated.

Further, as indicated by arrows 35 in FIG. 4, the heat dissipated from the heat dissipation portion 20 rides on the airflow 34 generated in the convection area 33, is dissipated to the outside of the electronic device 100 (outside of the housing 10 and the heat dissipation portion 20), and is not transferred to the housing cover 30.

Although illustration is omitted in FIG. 4, the circuit board 40 and the right side surface of the housing 10 are separated from each other to some extent in order to provide an electronic component such as a connector between the circuit board 40 and the right side surface of the housing 10.

On the other hand, when no other electronic component is provided between the circuit board 40 and the right side surface of the housing 10, an interval between the circuit board 40 and the right side surface of the housing 10 can be made shorter than that shown in FIG. 4.

As described above, in the electronic device 100 according to the present embodiment, the heat from the heat-generating element 41 is transferred to the heat dissipation portion 20 via the heat transfer member 22, the heat transfer member 22 has a shape not hindering the convection, and the convection area 33 is provided between the heat dissipation portion 20 and the housing cover 30.

When the convection area 33 is provided between the heat dissipation portion 20 and the housing cover 30 in a case of dissipating the heat from the heat-generating element 41, a distance between the electronic device and other adjacent electronic devices can be secured, and heat in the convection area 33 is thermally insulated by the housing cover 30.

Accordingly, it is possible to prevent heat transfer to other adjacent electronic devices, and it is also possible to prevent heat transfer from other adjacent electronic devices.

In addition, in the electronic device 100 according to the present embodiment, the air intake ventilation holes 11 are provided in the lower surface of the housing 10, the air exhaust ventilation holes 12 are provided in the upper surface of the housing 10, and the openings 31 and 32 are provided in the lower surface and the upper surface between the heat dissipation portion 20 and the housing cover 30.

Accordingly, the natural convection from the air intake ventilation holes 11 via the heat transfer member 22 in the housing 10 toward the air exhaust ventilation holes 12, and the natural convection from the opening 31 via the convection area 33 toward the opening 32 can be generated. When the natural convection can be generated as described above, cooling can be performed by mainly using the natural convection. Therefore, as compared with a configuration in which the forced convection is used, power consumption can be reduced, and a life problem of the fan or the like can be avoided.

Further, in the electronic device 100 according to the present embodiment, the heat transfer member 22 has the cylindrical shape, and has a shape not hindering the convection from a lower side to an upper side with respect to the gravity direction, which is directed from the air intake ventilation holes 11 to the air exhaust ventilation holes 12.

Accordingly, it is possible to prevent an influence of heat dissipation from the heat transfer member 22 on the components inside the electronic device 100.

In the electronic device 100 according to the first embodiment described above, the heat transfer member 22 has the cylindrical shape.

However, the heat transfer member 22 is not limited to having the cylindrical shape.

(First Modification)

FIG. 5 is a cross-sectional view of a cross section including a heat transfer member of an electronic device according to a first modification.

As shown in FIG. 5, in an electronic device 110 according to the first modification, the heat transfer member 22 is formed in a hexagonal column shape. In addition, the hexagonal-column-shaped heat transfer member 22 shown in FIG. 5 is disposed such that vertices of the hexagon face up and down.

Even when the heat transfer member 22 is formed in the hexagonal column shape as described above, since an airflow that enters in through the air intake ventilation holes 11 of the housing 10, as indicated by the arrows 24 in FIG. 5 is not hindered, it is possible to prevent an influence due to heat dissipation from the heat transfer member 22.

(Second Modification)

FIG. 6 is a cross-sectional view of a cross section including a heat transfer member of an electronic device according to a second modification.

As shown in FIG. 6, in an electronic device 120 according to the second modification, the heat transfer member 22 is formed in a pentagonal column shape. Then, the pentagonalcolumn-shaped heat transfer member 22 shown in FIG. 6 is disposed such that a vertex of the pentagon faces downward.

Even when the heat transfer member 22 is formed in the pentagonal column shape as described above, since an airflow that enters in through the air intake ventilation holes 11 of the housing 10, as indicated by the arrows 24 in FIG. 6 is not hindered, it is possible to prevent an influence due to heat dissipation from the heat transfer member 22.

(Other Modifications)

In the embodiment and the modifications described above, the shape of the heat transfer member 22 is described as the cylindrical shape, the hexagonal column shape, and the pentagonal column shape, but the shape of the heat transfer member is not limited to the three shapes.

For example, the heat transfer member may have an elliptical column shape, a quadrangular column shape disposed such that diagonal lines of the quadrangle are in the gravity direction, and the like. Further, the shape of the heat transfer member may have a configuration in which the flat-plate-shaped fin or the like is added to various shapes described above. The fin or the like is added, so that the convective air hits the protrusion. Therefore, the heat dissipation can be efficiently performed, and the cooling effects can be improved.

If the heat transfer member is configured so as not to receive the convection on a surface perpendicular to the convection direction, the convection is not hindered.

In the embodiment described above, a surface of the heat dissipation portion 20 on the housing cover 30 side (a surface on a convection area 33 side) has a flat plate shape.

On the other hand, a protrusion such as a flat-plate-shaped fin that protrudes toward the convection area may be added to a surface of the heat dissipation portion on the convection area side. Accordingly, since the convective air hits the protrusion, the heat can be efficiently dissipated, and the cooling effects can be improved. In addition, as long as the convection area can be secured without hindering the convection in the space between the housing cover and the heat dissipation portion, the heat influence on the adjacent modules or the like is prevented by adding the protrusion such as a fin.

In the embodiment and the modifications described above, in order to generate the natural convection in the housing 10 and the convection area 33, the ventilation holes 11 and 12 and the openings 31 and 32 are provided in the lower surface and the upper surface to use the natural convection.

The invention is not limited to the configuration in which the natural convection is used as described above, a configuration in which the natural convection and the forced convection are used together, or a configuration in which the forced convection is mainly used can also be adopted. When the forced convection is used, the convection is compulsively generated by a fan or the like.

As described above, even when the forced convection is used, it is desirable to provide ventilation holes, openings, or the like that are inlet and outlet for the air. When the forced convection is used, the ventilation holes, the openings, or the like is not limited to being provided in the lower surface and the upper surface, and can also be provided in a side surface. In this case, the positions of the ventilation holes or the openings and specifications of a configuration for the forced convection such as a fan (an installation position, an air direction, an air volume, and the like) are set such that the convection passes through a side surface of the heat transfer member and a position of the heat dissipation portion corresponding to the heat transfer member.

When the forced convection is used, problems such as power consumption and life of the configuration for compulsively generating the convection such as a fan as described above occur.

On the other hand, when the natural convection is mainly used, the power consumption can be reduced, and the life problem of the fan or the like can be avoided.

In the embodiment described above, the configuration is adopted in which the housing 10 includes the front side surface, the lower surface, the upper surface, and the right side surface, the heat dissipation portion 20 includes the left side surface and the back side surface, and the housing cover 30 includes the front side surface, the left side surface, and the back side surface.

The shape of each of the housing, the heat dissipation portion, and the housing cover is not limited to the shape in the embodiment described above. A shape that can implement both housing the heat-generating element, the circuit board, and the heat transfer member in the housing and securing the convection area may be used. For example, a tubular member including openings in a lower surface and an upper surface may serve as the heat dissipation portion and the housing cover, and the tubular member may be attached to a housing including an opening in one surface.

The preferable embodiment and modifications of the invention have been described above, but the invention is not limited to the embodiment described above, and various modifications can be made within a scope not departing from the gist of the invention. The embodiment and the modifications described above have been described in detail in order to describe the invention in an easy-to-understand manner, and are not limited to necessarily including all described configurations.

REFERENCE SIGNS LIST

10: housing
11: air intake ventilation hole
12: air exhaust ventilation hole
20: heat dissipation portion
21, 23: thermally conductive member
22: heat transfer member
30: housing cover
31, 32: opening
33: convection area
40: circuit board
41: heat-generating element
100, 110, 120: electronic device

The invention claimed is:

1. An electronic device comprising:
a circuit board on which a heat-generating element configured to generate heat is mounted;
a housing in which the circuit board is housed;
a heat dissipation portion connected to the housing and configured to dissipate heat;
a heat transfer member disposed between the heat-generating element and the heat dissipation portion, and configured to transfer heat generated by the heat-generating element to the heat dissipation portion; and
a housing cover provided on a side of the heat dissipation portion opposite to a side of the heat transfer member, wherein
a first convection area that is a space where air convection occurs between the heat dissipation portion and the housing cover is provided opposite one face of the heat transfer member and is the only convection area between the heat dissipation portion and the housing cover, the first convection area having a first opening adjacent a lower end of the housing cover between the heat dissipation portion and the housing cover for allowing air to flow into the first convection area and a second opening at an upper end of the housing cover between the heat dissipation portion and the housing cover for discharging air from the first convection area to an outside,
the housing defines a second convection area and comprises an air intake ventilation hole, provided in a lower surface of the housing, for taking air into the housing, and an air exhaust ventilation hole, provided in an upper surface of the housing, for discharging the air in the housing to the outside, the air intake ventilation hole and the air exhaust ventilation hole are separate from the first and second openings, the air intake ventilation hole and first opening are provided in a plane defined by the lower surface of the housing, and the air exhaust ventilation hole and second opening are provided in a plane defined by the upper surface of the housing,
an airflow is configured to flow through the air intake ventilation hole, along opposite side surfaces of the heat transfer member, and is exhausted through the air exhaust ventilation hole from an upper portion of the heat transfer member, and
the heat transfer member has a cross-sectional shape that does not interfere with the airflow.

2. The electronic device according to claim 1, wherein the heat transfer member has a cylindrical shape or a polygonal column shape having five or more corners.

* * * * *